United States Patent
Quitoriano et al.

(10) Patent No.: US 8,030,729 B2
(45) Date of Patent: Oct. 4, 2011

(54) DEVICE FOR ABSORBING OR EMITTING LIGHT AND METHODS OF MAKING THE SAME

(75) Inventors: Nathaniel Quitoriano, Pacifica, CA (US); Theodore I. Kamins, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 69 days.

(21) Appl. No.: 12/243,804

(22) Filed: Oct. 1, 2008

(65) Prior Publication Data
US 2009/0189144 A1 Jul. 30, 2009

Related U.S. Application Data

(60) Provisional application No. 61/024,529, filed on Jan. 29, 2008.

(51) Int. Cl.
*H01L 31/06* (2006.01)

(52) U.S. Cl. ............ 257/461; 257/12; 257/E21.09; 438/24; 438/478; 977/932; 977/950; 977/953

(58) Field of Classification Search ............ 257/12, 257/461, 465, E21.09; 438/24, 478; 977/932, 977/950, 953
See application file for complete search history.

(56) References Cited

U.S. PATENT DOCUMENTS

| | | | |
|---|---|---|---|
| 7,202,173 B2 * | 4/2007 | Hantschel et al. | 438/694 |
| 7,608,530 B2 * | 10/2009 | Kobayashi et al. | 438/489 |
| 2005/0009224 A1 | 1/2005 | Yang | |
| 2006/0207647 A1 * | 9/2006 | Tsakalakos et al. | 136/256 |
| 2007/0041301 A1 * | 2/2007 | Kurt et al. | 369/94 |
| 2007/0047056 A1 | 3/2007 | Kempa | |
| 2008/0073743 A1 * | 3/2008 | Alizadeh et al. | 257/461 |
| 2008/0116465 A1 * | 5/2008 | Moon et al. | 257/79 |
| 2008/0156366 A1 * | 7/2008 | Kim et al. | 136/255 |
| 2009/0294755 A1 * | 12/2009 | Kuekes et al. | 257/9 |

FOREIGN PATENT DOCUMENTS

WO   WO 2004055786 A1 *   7/2004

* cited by examiner

*Primary Examiner* — Matthew Smith
*Assistant Examiner* — Christine Enad

(57) ABSTRACT

A device disclosed herein includes a first layer, a second layer, and a first plurality of nanowires established between the first layer and the second layer. The first plurality of nanowires is formed of a first semiconductor material. The device further includes a third layer, and a second plurality of nanowires established between the second and third layers. The second plurality of nanowires is formed of a second semiconductor material having a bandgap that is the same as or different from a bandgap of the first semiconductor material.

27 Claims, 2 Drawing Sheets

DEVICE FOR ABSORBING OR EMITTING LIGHT AND METHODS OF MAKING THE SAME

CROSS-REFERENCE TO RELATED APPLICATION

The present application claims priority from provisional application Ser. No. 61/024,529, filed Jan. 29, 2008, the contents of which are incorporated herein by reference in their entirety.

BACKGROUND

The present disclosure relates generally to devices for absorbing or emitting light and to methods of making the same.

Since the inception of semiconductor technology, a consistent trend has been toward the development of smaller device dimensions and higher device densities. As a result, nanotechnology has seen explosive growth and generated considerable interest. Nanotechnology is centered on the fabrication and application of nano-scale structures, or structures having dimensions that are often 5 to 100 times smaller than conventional semiconductor structures. Nanowires are included in the category of nano-scale structures.

Nanowires are wire-like structures having at least one linear dimension (e.g., diameter) ranging from about 1 nm to about 1 μm. For some applications, it may be desirable that the wire-like structures have at least one linear dimension as large as 10 μm. Nanowires are suitable for use in a variety of applications, including functioning as conventional wires for interconnection applications or as semiconductor devices. Nanowires are also the building blocks of many potential nano-scale devices, such as nanoscale field effect transistors (FETs), p-n diodes, light emitting diodes (LEDs) and nanowire-based sensors, to name a few.

BRIEF DESCRIPTION OF THE DRAWINGS

Features and advantages of embodiments of the present disclosure will become apparent by reference to the following detailed description and drawings, in which like reference numerals correspond to the same or similar, though perhaps not identical, components. For the sake of brevity, reference numerals having a previously described function may or may not be described in connection with subsequent drawings in which they appear.

DETAILED DESCRIPTION

Embodiments of the device disclosed herein advantageously include multiple sets of nanowires, each of which has a bandgap that is the same as or different from a bandgap of each of the other sets. In embodiments in which the respective sets of nanowires have different bandgaps, each set may advantageously absorb/sense or emit light of a wavelength/range of wavelengths that is different from each other set. Such devices may be particularly suitable for use as, for example, multi-color photodetector and image sensors, multi-junction solar cells, or multi-junction LED pixels.

It is to be understood that throughout the detailed description, various layers and pluralities of nanowires are discussed. It is to be understood that such layers and nanowires have the same conductivity type when it is desirable that the resulting device be photoconductive, and that such layers and nanowires may have different conductivity types when it is desirable that the resulting device includes one or more p-n or p-i-n junctions.

Figure 1:
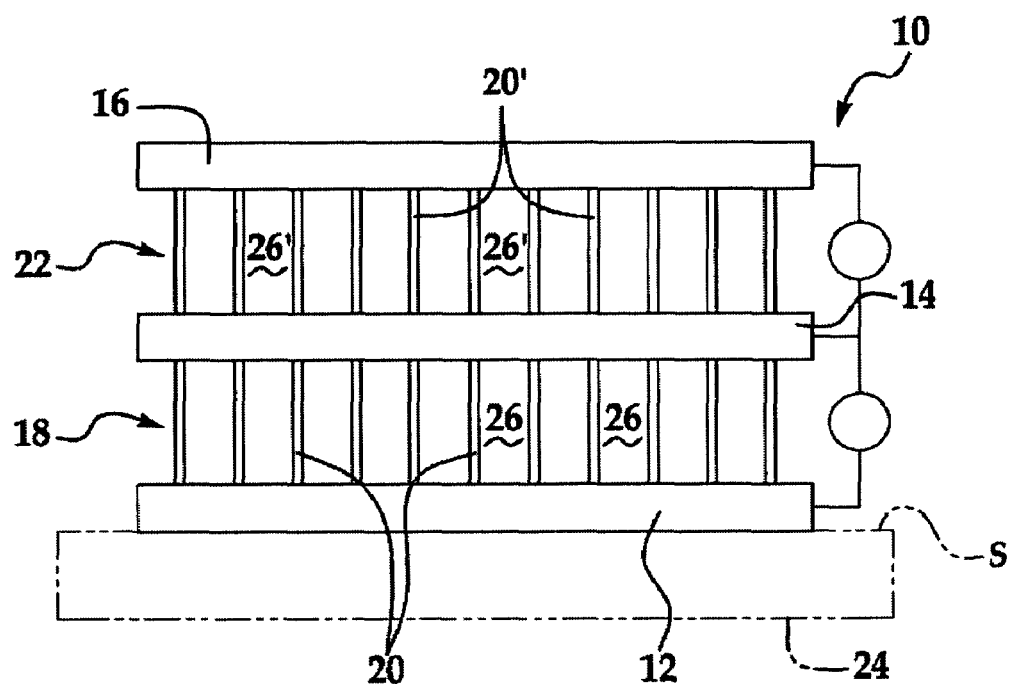
FIG. 1 is a schematic view of an embodiment of a device including multiple sets of nanowires.

Referring now to FIG. 1, an embodiment of the device 10 is depicted. The device 10 generally includes a first layer 12, a second layer 14, and a third layer 16. Established between the first layer 12 and the second layer 14 is a first plurality 18 of nanowires 20, and established between the second layer 14 and the third layer 16 is a second plurality 22 of nanowires 20'.

It is to be understood that one of the layers 12, 16 positioned at an end of the device 10 may function as a substrate for the device 10. In such embodiments, the layer 12, 16 functioning as the substrate generally has a thickness that is greater than the other layers 16, 14, 12 in the device 10. Generally, the non-substrate layers 12, 14, 16 have a thickness that allows light (at least light of a desirable wavelength/range of wavelengths) to penetrate therethrough. As non-limiting examples, the substrate 24 (or layer 12, 16 functioning as a substrate) has a thickness ranging from about 100 microns to about 1000 microns, and the other layers 16, 14, 12 have a thickness ranging from about 100 nm to about 10 microns.

In other embodiments, one of the layers 12, 16 may be established on a separate substrate 24. Non-limiting examples of suitable substrate materials include amorphous materials, polycrystalline materials, or single crystalline materials. More specifically, the substrate 24 may be a conducting material (e.g., metal) or a semiconductor material (e.g., silicon). In some instances, the substrate 24 is insulating (e.g., glass, $SiO_2$), or includes an insulating layer (not shown) established i) between conducting portions of the substrate 24, ii) at a surface S upon which the layer 12, 16 is established, or iii) at a surface of the substrate 24 opposed to the surface S upon which the layer 12, 16 is established. It is to be understood that the substrate 24 may be insulating as long as the layer 12, 16 established thereon is conducting or semiconducting. It is to be further understood that unless it is desirable to illuminate the device 10 through the substrate 24, the substrate 24 may not be transparent to one or more wavelengths/range of wavelengths of interest.

If an additional substrate 24 is used, the desirable layer 12, 16 may be established on the substrate 24 via any suitable deposition technique. Non-limiting examples of such techniques includes bonding, evaporation, electron-beam evaporation, sputtering, chemical vapor deposition (CVD), low-pressure chemical vapor deposition (LPCVD), physical vapor deposition (PVD), or other like techniques.

Generally, materials suitable for forming the layers 12, 14, 16 may be amorphous, polycrystalline, or single crystalline. Furthermore, the layers 12, 14, 16 of the device 10 may be formed of semiconductor materials (e.g., silicon, germanium, gallium phosphide, aluminum phosphide, or the like) or conducting materials (e.g., metals, indium tin oxide, or the like). In some instances, all of the layers 12, 14, 16 are formed of conducting materials. In other instances, the outermost layer (e.g., the layer first exposed to light, or layer 16 in FIG. 1) is formed of a conducting material, and the other layers 12, 14 are formed of semiconductor materials. As one non-limiting example, the first and second layers 12, 14 are formed of doped polycrystalline silicon, doped polycrystalline gallium phosphide, or doped polycrystalline aluminum phosphide, and the third layer 16 is formed of indium tin oxide.

It is to be understood that insulating materials are generally not suitable for forming the layers 12, 14, 16, but may, for example, be embedded within or established under or on one of the layers 12, 14, 16. Furthermore, a conducting or semiconducting layer is generally desirable at each end of each plurality 18, 22 of nanowires 20, 20'. As non-limiting examples, an insulating layer (not shown) may be embedded in layer 14 or may be established on a surface of layer 16 opposed to the nanowires 20'. If an insulating layer is positioned immediately adjacent to the nanowires 20, 20', the nanowires 20, 20' can physically attach to the insulating layer, however, there would not be a conducting path. Such an embodiment may be desirable in some instances.

The layers 12, 14, 16 may have the same conductivity type or may have different conductivity types. In one embodiment, all of the layers 12, 14, 16 (and all of the nanowires 20, 20' therebetween) have the same conductivity type (e.g., when it is desirable that the device 10 operate in photoconductive mode). In another embodiment, adjacent layers 12, 14, 16 have opposite conductivity types. For example, the device 10 shown in FIG. 1 may have the first layer 12 and the third layer 16 doped to exhibit n-type or p-type conductivity, and the second layer 14 doped to exhibit the other of p-type or n-type conductivity. In such embodiments, the nanowires 20, 20' may be lightly doped or undoped, thereby forming p-i-n structures.

Still further, in an embodiment, the respective layers 12, 14, 16 may include sub-layers (not shown) that are doped to form a tunnel junction therein. As a non-limiting example, the layer 14 includes a first sub-layer doped to have $p^+$-type conductivity (indicating a higher level of doping than p alone), and a second layer doped to have $n^+$-type conductivity (indicating a higher level of doping than n alone). Such a layer 14 may also include a sub-layer doped to have p-type conductivity adjacent the $p^+$-type layer and opposed to the $n^+$-type layer, and another sub-layer doped to have n-type conductivity adjacent the $n^+$-type layer and opposed to the $p^+$-type layer.

A layer having a $p^+$-type-$n^+$-type junction formed therein may also include a transparent conductor established between the $p^+$-type and $n^+$-type layers. It is to be understood that if the transparent conductor is included such that it makes ohmic contact to both n-type and p-type layers, then a $p^+$-type conductivity layer and an $n^+$-type conductivity layer may or may not be included.

The layers 12, 14, 16 may also be substantially transparent. As used herein, the phrase "substantially transparent" means that the material selected for the layer 12, 14, 16 allows light of a predetermined wavelength or range of wavelengths to pass therethrough. It is to be understood that any layer functioning as the substrate or established on the substrate 24 may not be substantially transparent, unless it is desirable to illuminate the device 10 through that particular layer 12, 16 and/or substrate 24. In an embodiment, the layers 14, 16 are substantially transparent to at least the wavelength/range of wavelengths that is to be absorbed by or emitted from the first plurality 18 of nanowires 20 (i.e., the lowest set of nanowires in the device 10). In some instances, the layers 14, 16 are substantially transparent to all wavelengths/ranges of wavelengths of interest.

The layers 12, 14, 16 may also be selected such that they are filters for certain wavelengths/ranges of wavelengths. It is believed that this enables more control over which wavelengths/ranges of wavelengths reach the nanowires 20, 20'.

As previously mentioned, the first plurality 18 of nanowires 20 extends between the first and second layers 12, 14 and the second plurality 22 of nanowires 20' extends between the second and third layers 14, 16. The nanowires 20, 20' may be vertically oriented, oriented at any non-zero angle from the vertical, or combinations thereof. In some instances the nanowires 20, 20' are randomly oriented (i.e., the plurality 18, 22 includes vertical and non-vertically angled nanowires 20, 20').

Generally, the orientation of the nanowires 20, 20' depends, at least in part, on the crystallography of the layer 12, 14, 16 from which the nanowires 20, 20' are grown. For example, vertical nanowires 20, 20' are grown from a single crystalline layer. The formation of nanowires 20, 20' at non-zero angles from the vertical may be achieved by selecting the layer 12, 14, 16 having a suitable crystallographic orientation for forming such an angled nanowire 20, 20'. Still further, when an amorphous or polycrystalline layer 12, 14, 16 is used, there is no single orientation and so the growing nanowires 20, 20' are oriented in different directions (i.e., not in the same direction).

It is to be understood that the respective nanowires 20, 20' are established such that an electrical connection (e.g., with one of layers 12, 14, 16) is made at both ends of at least some of the nanowires 20, 20'. Such nanowires 20, 20' are generally grown from the layer 12, 14 and are connected to another layer 14, 16. It is to be further understood that some of the nanowires 20, 20' may not be connected at both ends to a respective layer(s) 12, 14, 16. Such nanowires 20, 20' are physically present, but do not contribute to the electrical performance of the device 10.

Growth may be accomplished using catalyst nanoparticles, anisotropic or selective area growth, and/or etching. When using catalyst nanoparticles, it is to be understood that the material that forms the nanowires 20, 20' is supplied, for example, in the form of a gaseous precursor containing one or more components of material that form the nanowires 20, 20'. Such materials may also be supplied by physical transport (i.e., from the gas phase or from an underlying substrate/ layer). Anisotropic growth also requires supply of nanowire forming materials (e.g., from a gaseous source, by physical vapor deposition, or from an underlying substrate/layer). Selective area growth may be desirable in combination with the other techniques (e.g., anisotropic growth). It is to be understood that etching may be used to form the nanowires 20, 20' or may be used to form a substantially planar surface at one end of the nanowires 20, 20' (discussed further hereinbelow).

In an embodiment, forming the first plurality 18 of nanowires 20 may include establishing catalyst nanoparticles on the first layer 12. In one embodiment, the catalyst nanoparticles may be formed by depositing (on the first layer 12) material(s) that subsequently form the catalyst nanoparticle (e.g., upon exposure to heating). In another embodiment, pre-formed catalyst nanoparticles may be deposited on the first layer 12. In either embodiment, suitable deposition processes include, but are not limited to physical deposition processes, solution deposition processes, chemical deposition processes, electrochemical deposition processes, physical vapor deposition processes, chemical vapor deposition processes, and/or combinations thereof. Non-limiting examples of suitable catalyst nanoparticle materials include gold, titanium, platinum, palladium, gallium, nickel, or combinations thereof. Nanowire 20 growth may be initiated via exposing the catalyst nanoparticles to a precursor gas.

Generally, the nanowires 20, 20' are selected from semiconductor materials. Non-limiting examples of such materials include silicon, germanium, indium phosphide, gallium arsenide, gallium nitride, or the like, or alloys thereof, or combinations thereof. In some instances, the nanowires 20, 20' are formed of undoped or lightly doped materials.

In other instances, the growing nanowires 20 may be exposed to one or more dopants that is/are capable of introducing different conductivity types to one or more segments of the nanowire 20, 20'. Generally, the dopant is introduced with the precursor gas. In some instances, the nanowires 20, 20' are formed with segments that are doped differently, such that p-n junctions are formed along the length of the nanowires 20, 20'. For example, one of the segments is doped p-type or n-type and the other of the segments is doped the other of n-type or p-type. When the nanowires 20, 20' are doped to have segments with different conductivity types along their length, junctions (not shown) are axially formed in the nanowire 20, 20' at the interface of the two differently doped segments.

The nanowires 20, 20' may also be grown and doped to include multiple p-type and n-type segments, or to include an undoped or lightly doped (compared to the other doped segments and/or layers 12, 14, 16) semiconductor region between two doped regions. Dopants for introducing p-type conductivity into group IV semiconductors include, but are not limited to boron, other like elements, or combinations thereof; and dopants for introducing n-type conductivity into group IV semiconductors include, but are not limited to phosphorus, arsenic, antimony, other like elements, or combinations thereof. Different dopants may be suitable for group III-V materials, such as, for example silicon, carbon, zinc, or the like, or combinations thereof.

It is to be understood that the nanowires 20, 20' may also include a junction formed radially therein. Such nanowires 20, 20' are grown to a desirable length, and then the deposition conditions are changed so as to grow a shell of a differently doped material or of a different material on the previously formed nanowires 20, 20' (described further in reference to FIGS. 3A and 3B). This junction is located at the interface of the core nanowire 20, 20' and its shell. In other instances, a junction may be formed radially in the nanowire 20, 20' using diffusion doping or depositing at temperatures where non-catalyzed growth is favorable such that growth occurs on all surfaces.

In some embodiments, the nanowires 20, 20' may be clad with a material having a lower refractive index than the refractive index of the nanowire material. It is believed that such a material may assist in retaining light within the nanowires 20, 20' until such light is absorbed by the active region. It is to be understood that with a suitable combination of refractive indices and a shallow angle, light in the nanowires 20, 20' may be totally internally reflected and may not penetrate from a high refractive index core into low refractive index cladding layer. In addition, a properly formed coating on the nanowire 20, 20' may reduce the nanowire 20, 20' surface-state or interface-state density and therefore reduce the surface recombination so that the photogenerated carriers are collected, rather than recombined at the surface of the nanowire 20, 20'.

After the first plurality 18 of nanowires 20 is grown, a layer 26 may be formed on the first layer 12 such that it surrounds each of the nanowires 20. Such a layer 26 may be grown or deposited. Non-limiting examples of materials suitable for the layer 26 include substantially transparent conducting materials (e.g., indium tin oxide) or substantially transparent insulating materials (e.g., silicon dioxide, silicon nitride, or the like). Such materials are generally transparent to the wavelength/range of wavelengths of interest that are to be absorbed or emitted by the nanowires 20, and may also be transparent to the wavelength/range of wavelengths of interest that are to be absorbed or emitted by the nanowires 20' (e.g., when backside illumination is used). It is to be understood that a substantially transparent conducting material may be particularly suitable when the nanowires 20 have a core/shell configuration (described further in reference to FIGS. 3A and 3B).

The layer 26 may be established such that it fills the entire space between adjacent nanowires, and, in some instances, such that it covers any exposed ends of the nanowires 20. The layer 26 and the nanowires 20 may then be exposed to planarization (e.g., CMP or chemical mechanical planarization/polishing) to form a substantially planar surface in which an end of at least some of the nanowires 20 is exposed. The second layer 14 is then established on this planar surface such that an electrical connection is formed between the nanowires 20 and the second layer 14. The second layer 14 may be deposited via any suitable method, including, but not limited to evaporation, electron-beam evaporation, sputtering, chemical vapor deposition (CVD), physical vapor deposition (PVD), low-pressure chemical vapor deposition (LPCVD), pulsed laser deposition, or other like techniques.

Generally, the second plurality 22 of nanowires 20' is then grown from the second layer 14. It is to be understood that the process described hereinabove for forming the first plurality 18 may be used to form the second plurality 22 of nanowires 20'. However, etching is generally not used to form the nanowires 20'. In this embodiment however, the catalyst nanoparticles are established on the second layer 14, such that the nanowires 20' are grown therefrom. Another layer 26' (similar to layer 26) may be formed around the nanowires 20'. This other layer 26' may be transparent to the wavelength/range of wavelengths of interest that are to be absorbed or emitted by the nanowires 20', and may also be transparent to the wavelength/range of wavelengths of interest that are to be absorbed or emitted by the nanowires 20. The layer 26' and the nanowires 20' may then be exposed to planarization (e.g., chemical mechanical planarization) to form another substantially planar surface upon which the third layer 16 is established such that an electrical connection is formed between the nanowires 20' and the third layer 16.

In some instances, the nanowires 20 of the first plurality 18 and the nanowires 20' of the second plurality 22 are formed of the same semiconductor material. As such, the nanowires 20, 20' have the same bandgap and are capable of absorbing or emitting light of the same wavelength or range of wavelengths.

In other instances, the nanowires 20 of the first plurality 18 and the nanowires 20' of the second plurality 22 are formed of semiconductor materials having different bandgaps. In such embodiments, the first plurality 18 is capable of absorbing or emitting light of a first wavelength or range of wavelengths, and the second plurality 22 is capable of absorbing or emitting light of a second wavelength or range of wavelengths that is different from the first wavelength or range of wavelengths. In some instances, each of the plurality 18, 22 of nanowires 20, 20' has a high sensitivity to light of a different wavelength or range of wavelengths.

It is to be understood that the materials for the respective pluralities 18, 20 may depend, at least in part, on the desirable characteristics of final device 10. In a non-limiting example, the materials are selected such that the nanowires 20, 20' function as lightly doped light absorbing crystalline layers and the layers 12, 14, 16 function as doped semiconductors that gather free carriers generated by the incident light. As used in combination with device 10 operation, "lightly doped" means that the dopant concentration is less than the carrier concentration generated by the incident light so that the conductance of the nanowire 20, 20' changes greatly when light is incident on it.

In another non-limiting example in which illumination occurs through layer 16, the plurality 18 of nanowires 20 is configured such that it absorbs or emits light of the longest wavelength (i.e., longer than light absorbed or emitted by any other plurality 22 in the device 10). In such instances, little (if any) of the light of this wavelength/range of wavelengths is absorbed by the other pluralities 22. It is to be understood that light striking the other plurality 22 at an angle may be transmitted through the nanowires 20' and continue toward the plurality 18. In some instances, the transmissivity of the nanowires 20' to the light corresponding to the plurality 18 may be increased by selecting a material for the nanowires 20' that is highly transmissive to such light.

Generally, light travels between nanowires 20' in the outermost plurality 22 (assuming top-side illumination) so that it reaches the nanowires 20 in the lower pluralities 18. In some instances, more nanowires 20' in the outermost plurality 22 may obstruct a larger fraction of the light from traveling to the power pluralities 18. Without being bound to any theory, it is believed that such light obstruction results when the wavelengths/range of wavelengths absorbed by each of the pluralities 18, 20 of nanowires 20, 20' overlap.

In another non-limiting example (assuming back-side illumination), the plurality 22 of nanowires 20' is configured such that it absorbs or emits light of the longest wavelength (i.e., longer than light absorbed or emitted by any other plurality 20 in the device 10).

Figure 2:
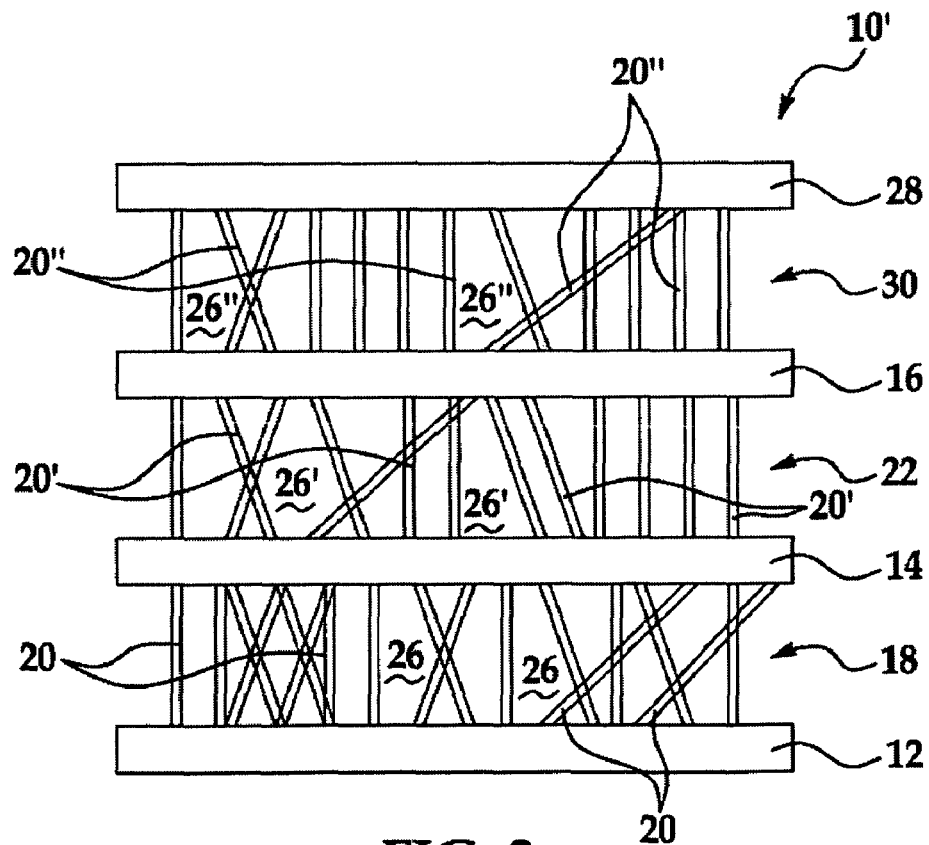
FIG. 2 is a schematic view of another embodiment of a device including multiple sets of nanowires.

It is to be understood that while two pluralities 18, 22 of nanowires 20, 20' are shown in the device 10, any number of additional nanowire sets and corresponding layers may be formed. FIG. 2 illustrates an embodiment of the device 10' including a third plurality 30 of nanowires 20" established between the third layer 16 and a fourth layer 28. The materials and processes for forming the other layers 12, 14, 16 and nanowires 20, 20' may be used to form the additional plurality/pluralities 30 and layer(s) 28. Layers 26, 26', 26" are established between the respective nanowires 20, 20', 20" during formation of the device 10'.

As a non-limiting example of the device 10' of FIG. 2, the pluralities 18, 22, 30 of nanowires 20, 20', 20" may be undoped or lightly doped, while the first and third layers 12, 16 are doped to have n- or p-type conductivity and the second and fourth layers 14, 28 are doped to have the other of p- or n-type conductivity.

It is to be understood that the nanowires 20, 20', 20" in FIG. 2 may also be doped to include a p-n junction or a p-i-n junction at a position along the length of the nanowire 20, 20', 20".

In another non-limiting example (e.g., when it is desirable that the device 10' function in photoconductive mode), the layers 12, 14, 16, 28 (and the nanowires 20, 20', 20") are all doped to have the same conductivity type.

Furthermore, the nanowires 20" (and any other additional nanowires in the device 10, 10') may be formed of the same or different semiconductor materials than the other nanowires 20, 20'. Generally, a different semiconductor material enables a different wavelength/range of wavelengths to be absorbed by or emitted from the additional nanowires 20".

Figure 3A:
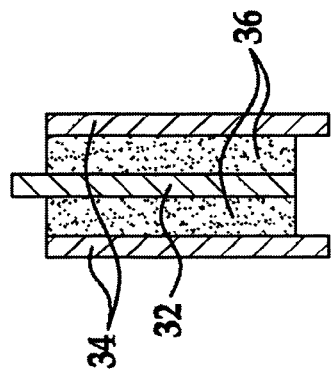
FIG. 3A is a top perspective view of an embodiment of a nanowire having a core/shell configuration.
Figure 3B:
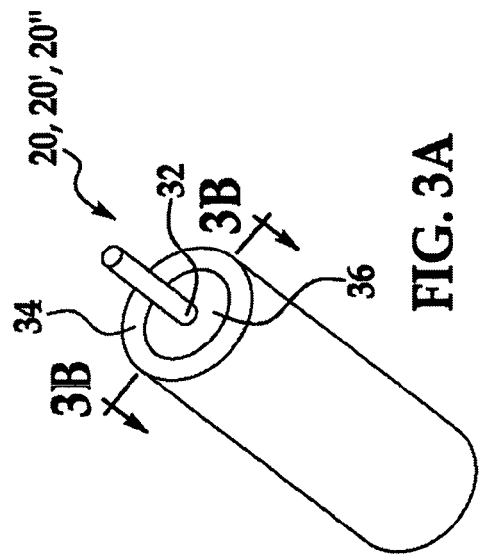
FIG. 3B is a cross-sectional view taken along the 3B-3B line of FIG. 3A.

FIGS. 3A and 3B illustrate another embodiment of the nanowires 20, 20', 20". In this embodiment, the nanowires 20, 20', 20" include a core 32, a shell 34 and a light absorbing layer 36 established therebetween. Generally, the core 32 is formed during initial nanowire 20, 20', 20" growth, and is doped to have a first conductivity type. Doping of the core 32 may be accomplished during growth of the nanowire 20, 20', 20" as described hereinabove, or may be accomplished by introducing or adding (e.g., via diffusion) the dopant after growth of the nanowire 20, 20', 20".

The light absorbing layer 36 is then established on the doped core 32. It is to be understood that the light absorbing layer 36 may be lightly (intrinsic) doped (in this embodiment, "light (intrinsic) doped" means that the light absorbing layer 36 includes less dopant than the core 32 and/or the shell 34). The light absorbing layer 36 may be doped with the same or a different conductivity type than the core 32 and/or shell 34, depending, at least in part, on the desirable function of the device 10, 10'. The light absorbing layer 36 may also be formed of the same or a different semiconductor material than the core 32 material. In some instances, the light absorbing layer 36 is grown on the core 32, and in other instances, the light absorbing layer 36 is established on the core 32.

The nanowire 20, 20', 20" shown in FIGS. 3A and 3B also includes the shell 34 established on the light absorbing layer 36. The shell 34 may be grown or otherwise established on the light absorbing layer 36.

When it is desirable that the device 10, 10' function in photoconductive mode, it is to be understood that the core 32, light absorbing layer 36 and shell 34 have the same conductivity type as the layers 12, 14, 16, 28.

If the shell 34 is a semiconductor material, it may be doped to have a conductivity type that is different than the conductivity type of the core 32. In this embodiment, the core 32 and shell 34 are collecting electrodes. The light absorbing layer 36 between the core 32 and shell 34 forms a p-i-n or n-i-p diode. This structure may be illuminated along the axis of the nanowire 20, 20', 20" or at any desirable angle.

When such core/shell nanowires 20, 20', 20" are used in the embodiments of the device 10, 10' disclosed herein, the inner cores 32 may be connected at either the top or bottom of the plurality 18, 22, 30 (i.e., to one of the respective layers 12, 14, 16, 28 between which the nanowires 20, 20', 20" are formed), and the outer shells 34 may be connected at the other of the bottom or top of the plurality 18, 22, 30 (i.e., to the other of the respective layers 12, 14, 16, 28 between which the nanowires 20, 20', 20" are formed). With this structure, a relatively large light collecting path is formed (approximately the height of the nanowires 20, 20', 20"), while the distance between the two collecting electrodes (the core 32 and shell 34) remains short to allow rapid collection of photogenerated carriers and low recombination. It is believed that decoupling the light absorbing distance from the carrier collecting distance improves the performance of the device 10, 10'.

In an extension of the device 10, 10' including core/shell nanowires 20, 20', 20", an additional photodetector may be formed on or in the substrate 24. In such an embodiment, the nanowires 20, 20', 20" may be formed of the same or a different material (e.g., with a different absorption coefficient and cut-off wavelength) than the substrate 24. When the materials are different, light with one wavelength/range of wavelengths is absorbed in the nanowires 20, 20', 20", and light of another wavelength is absorbed in the substrate 24, thereby further increasing the overall collection efficiency. It is to be understood that the density, angle of illumination and optical reflection of the nanowires 20, 20', 20" may be altered to adjust the ratio of light absorbed in the nanowires 20, 20', 20" and light absorbed in the substrate 24 to be optimal for a specific application.

In any of the embodiments disclosed herein, a junction (not shown) for light absorption and/or emission may be desirably positioned within the device 10, 10'. It is to be understood that in instances when all of the layers 12, 14, 16, 28 and nanowires 20, 20', 20" are formed with the same conductivity type, no junction is formed in the device 10, 10', and the device 10, 10' is suitable for operating in photoconductive mode. When a junction is desirable, it is formed where two materials having differing conductivity types meet. More specifically, the junction may be formed i) axially along any of the nanowires 20, 20', 20", ii) at an interface between the nanowires 20, 20', 20" and a respective one of the layers 12, 14, 16, 28, and/or iii) at an interface between a core and a shell of any of the nanowires 20, 20', 20" (i.e., is formed radially within the nanowire 20, 20', 20"). It is to be understood that when included, the junction may be positioned to achieve desirable absorption and/or emission of the device 10, 10'.

Any of the embodiments of the device 10, 10' disclosed herein may be suitable for use as a multi-color photodetector and image sensor, a multifunction solar cell, or a multi-junction LED pixel.

In one embodiment of using the device 10, 10', light beams are directed into the device 10, 10'. Those light beams having a wavelength or range of wavelengths that correspond to a particular plurality 18, 22, 30 are absorbed by the nanowires 20, 20', 20" of that plurality 18, 22, 30. In embodiments in which each plurality 18, 22, 30 has a different bandgap, many different wavelengths/ranges of wavelengths may be absorbed and detected.

In another embodiment of using the device 10, 10', current is injected into the device 10, 10'. Current may be injected between any two of the layers 12, 14, 16, 28. Furthermore, current may be injected into different portions of the device 10, 10' simultaneously or sequentially. When current is introduced into the device 10, 10', light of a wavelength or range of wavelengths corresponding to the plurality 18, 22, 30 (located between the layers 12, 14, 16, 28 at which current is injected) is emitted from the nanowires 20, 20', 20" in that plurality 18, 22, 30. In embodiments in which each plurality 18, 22, 30 has a different bandgap, different wavelengths/ranges of wavelengths may be emitted.

Figure 4:
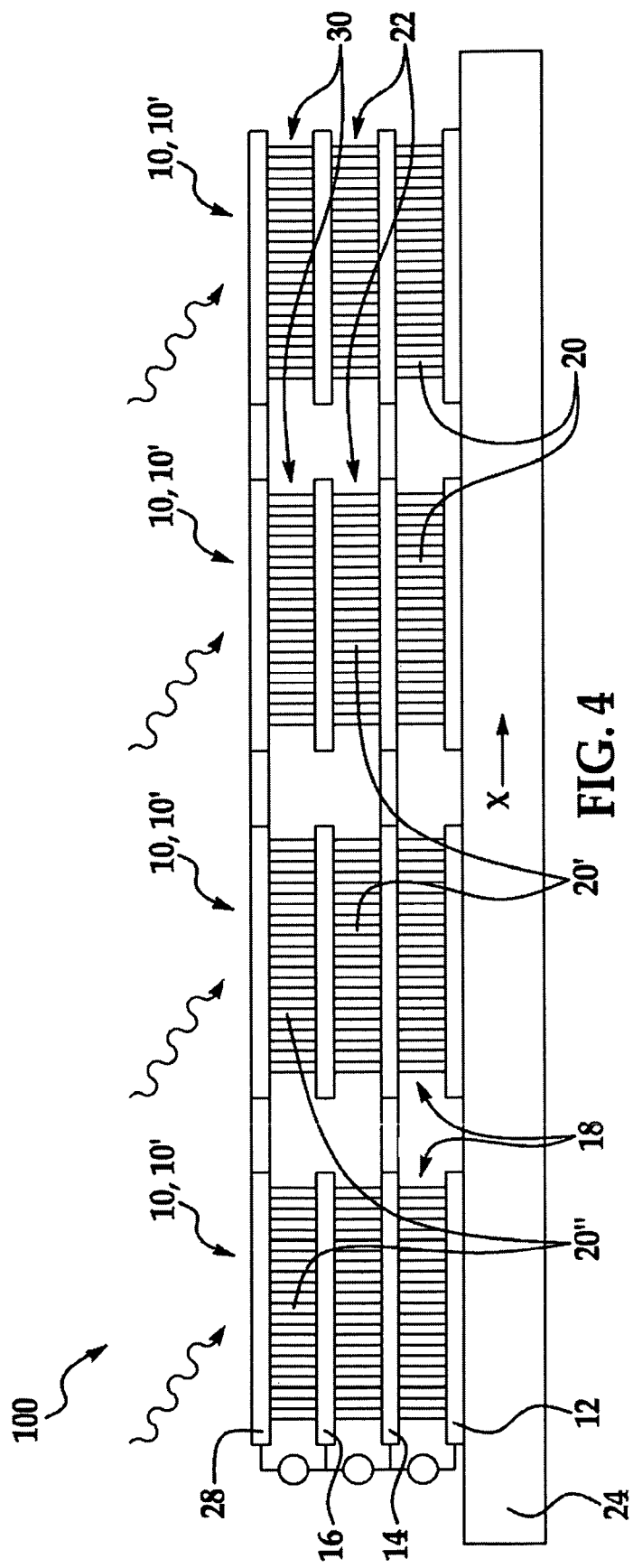
FIG. 4 is a schematic view of an embodiment of a multi-color photodetector and image sensor including a plurality of devices.

Referring now to FIG. 4, an embodiment of a multi-color photodetector and image sensor 100 is depicted. The multi-color photodetector and image sensor 100 includes a substrate 24 upon which several devices 10, 10' are integrated. It is to be understood that the details of the addressing circuitry are not shown in FIG. 4.

The photodetector or image sensor 100 contains a one- or two-dimensional array of devices 10, 10', each of which contains two or more pluralities 18, 22, 30 of nanowires 20, 20', 20". The spatial dimension of each device 10, 10' of the array in the plane of the substrate 24 is limited in at least one dimension. Access or address lines connected to the electrodes of the individual devices 10, 10' of the array allow an individual device 10, 10' to be accessed by circuitry peripheral to the array. This configuration enables individual access to the detected signal or to provide a signal for light emission at that individual device 10, 10'. For a two-dimensional array, for example, address lines in two (usually orthogonal) directions are used to select one device 10, 10' in the array. The electrodes of the nanowires 20, 20', 20" in an individual device 10, 10' may be selected portions of the access or address lines, rather than separate materials. For a color imager, three sets/pluralities of substantially vertically disposed nanowires 20, 20', 20" are used to sense three different wavelengths or wavelength ranges.

Embodiments of the device 10, 10' disclosed herein offer many advantages and may suitable be used for a number of applications. If desirable, the devices 10, 10' may be manufactured without single crystalline layers, which is believed to reduce the cost of manufacturing. Furthermore, the use of nanowires 20, 20', 20" is believed to substantially avoid issues with lattice mismatch often associated with using two different semiconductor materials adjacent to each other. Still further, the layers 12, 14, 16, 28 may be electrically isolated so that an interacting set of p-n junctions need not be reverse biased, thereby simplifying control of the voltages.

While several embodiments have been described in detail, it will be apparent to those skilled in the art that the disclosed embodiments may be modified. Therefore, the foregoing description is to be considered exemplary rather than limiting.

What is claimed is:

1. A device for absorbing or emitting light, comprising:
   a first layer;
   a second layer;
   a first plurality of nanowires established between the first and the second layers, the first plurality of nanowires formed of a uniform composition of a first semiconductor material and configured to absorb or emit light of a first wavelength or range of wavelengths;
   a third layer; and
   a second plurality of nanowires established between the second and third layers, the second plurality of nanowires formed of a uniform composition of a second semiconductor material having a bandgap that is different from a bandgap of the first semiconductor material, and the second plurality of nanowires configured to absorb or emit light of a second wavelength or range of wavelengths that is different from the first wavelength or range of wavelengths;
   the second layer physically separating each of the nanowires in the first plurality from each of the nanowires in the second plurality; and the second layer and at least one of the first layer or the third layer being formed of a semiconductor material or a conducting material.

2. The device as defined in claim 1 wherein at least one of the first layer, the second layer or the third layer is selected from amorphous materials, polycrystalline materials, and single crystalline materials.

3. The device as defined in claim 1 wherein at least one of the first layer or the second layer is formed of a doped semiconductor material selected from polycrystalline silicon, polycrystalline gallium phosphide, and polycrystalline aluminum phosphide.

4. The device as defined in claim 1 wherein the first layer and the third layer are doped to have one of n-type or p-type conductivity, and wherein the second layer is doped to have an other of p-type or n-type conductivity.

5. The device as defined in claim 1 wherein the first layer, the second layer and the third layer are doped to have a same conductivity type.

6. The device as defined in claim 1 wherein the first wavelength or range of wavelengths includes longer wavelengths than the second wavelength or range of wavelengths.

7. The device as defined in claim 1 wherein at least one of the first, second or third layers is substantially transparent to at least one of i) the first wavelength or range of wavelengths or ii) the second wavelength or range of wavelengths.

8. The device as defined in claim 1, further comprising:
   a fourth layer; and
   a third plurality of nanowires connecting the third layer to the fourth layer, the third plurality of nanowires formed of a uniform composition of a third semiconductor material having a bandgap that is different from the bandgap of the first semiconductor material and the bandgap of the second semiconductor material;

the third layer physically separating each of the nanowires in the second plurality from each of the nanowires in the third plurality.

9. The device as defined in claim 8 wherein the first layer and the third layer are doped to have one of n-type or p-type conductivity, and wherein the second and fourth layers are doped to have an other of p-type or n-type conductivity.

10. The device as defined in claim 8 wherein at least one of the first layer, the second layer, the third layer or the fourth layer is formed of a semiconductor material or a conducting material.

11. The device as defined in claim 1 wherein at least one of the first plurality of nanowires or the second plurality of nanowires is vertically oriented.

12. The device as defined in claim 1, further comprising a junction for light absorption located i) axially along a length of a nanowire in at least one of the first plurality of nanowires or the second plurality of nanowires, ii) at an interface between a nanowire in at least one of the first plurality of nanowires or the second plurality of nanowires and a respective one of the first layer, the second layer, or the third layer, iii) at an interface between a core and a shell of a nanowire in at least one of the first plurality of nanowires or the second plurality of nanowires, or iv) combinations of i, ii, and iii.

13. The device as defined in claim 1, further comprising a layer established between at least one of i) the first layer and the second layer or ii) the second layer and the third layer, and surrounding at least one of i) the first plurality of nanowires or ii) the second plurality of nanowires.

14. The device as defined in claim 1 wherein at least one of the first, second or third layers is selected as a filter for a predetermined wavelength or a predetermined range of wavelengths.

15. A method of using the device of claim 1, comprising:
directing one or more light beams into the device; and
absorbing or sensing different wavelength ranges in at least some of the first plurality of nanowires and the second plurality of nanowires.

16. A method of using the device of claim 1, comprising:
injecting current into the device; and
emitting light of different wavelength ranges from at least some of the first plurality of nanowires and the second plurality of nanowires.

17. The method as defined in claim 16 wherein injecting current into the device is accomplished by injecting current, simultaneously or sequentially, i) between the first layer and the second layer, ii) between the second layer and the third layer, iii) into different pluralities of nanowires, or iv) combinations of i, ii and iii.

18. The device as defined in claim 1 wherein the first set of nanowires includes a single layer of nanowires established between the first layer and the second layer, and wherein the second set of nanowires includes a single layer of nanowires established between the second layer and the third layer.

19. The device as defined in claim 1 wherein the first plurality of nanowires extends from the first layer to the second layer, and the second plurality of nanowires extends from the second layer to the third layer.

20. The device as defined in claim 1 wherein at least one of the first plurality of nanowires or the second plurality of nanowires is oriented at a non-zero angle from vertical, randomly oriented, or combinations thereof.

21. A method of making a device for absorbing or emitting light, comprising:
establishing a first plurality of nanowires between a first layer and a second layer, each nanowire in the first plurality of nanowires formed of a uniform composition of a first semiconductor material and configured to absorb or emit light of a first wavelength or range of wavelengths; and
establishing a second plurality of nanowires between the second layer and a third layer, each nanowire in the second plurality of nanowires formed of a uniform composition of a second semiconductor material having a bandgap that is different from a bandgap of the first semiconductor material, and configured to absorb or emit light of a second wavelength or range of wavelengths that is different from the first wavelength or range of wavelengths;
the second layer physically separating each of the nanowires in the first plurality from each of the nanowires in the second plurality, and the second layer and at least one of the first layer or the third layer being formed of a semiconductor material or a conducting material.

22. The method as defined in claim 21, wherein establishing the plurality of nanowires is accomplished by:
growing the first plurality of nanowires on the first layer;
forming a layer on the first layer such that it surrounds each nanowire in the first plurality of nanowires;
planarizing the layer having the first plurality of nanowires therein; and
establishing a first surface of the second layer on the planarized layer having the first plurality of nanowires therein.

23. The method as defined in claim 22 wherein establishing the second plurality of nanowires is accomplished by:
growing the second plurality of nanowires on a second surface of the second layer;
forming an other layer on the second surface of the second layer such that it surrounds each nanowire in the second plurality of nanowires;
planarizing the other layer having the second plurality of nanowires therein; and
establishing the third layer on the planarized other layer having the second plurality of nanowires therein.

24. The method as defined in claim 21, further comprising:
doping each of the nanowires in at least one of the first plurality of nanowires and the second plurality of nanowires to have a first conductivity type;
establishing a light absorbing layer on each of the doped nanowires; and
establishing a layer doped to have a second conductivity type on the light absorbing layer, the second conductivity type being different from the first conductivity type.

25. A photodetector and image sensor, comprising:
a substrate; and
a plurality of individually addressable devices established on the substrate, each of the plurality of individually addressable devices including:
a first layer;
a second layer;
a first plurality of nanowires established between the first and the second layers, the first plurality of nanowires formed of a uniform composition of a first semiconductor material and configured to absorb or emit light of a first wavelength or range of wavelengths;
a third layer; and
a second plurality of nanowires established between the second and third layers, the second plurality of nanowires formed of a uniform composition of a second semiconductor material having a bandgap that is different from a bandgap of the first semiconductor material, and the second plurality of nanowires configured to absorb or emit light of a second wavelength or range of wavelengths that is different from the first wavelength or range of wavelengths;

the second layer physically separating each of the nanowires in the first plurality from each of the nanowires in the second plurality, and the second layer and at least one of the first layer or the third layer being formed of a semiconductor material or a conducting material.

26. The photodetector and image sensor as defined in claim 25, further comprising address lines operatively connected to the layers of each of the plurality of individually addressable devices.

27. A device for emitting light, comprising:

a first layer;

a second layer;

a first plurality of nanowires established between the first and the second layers, the first plurality of nanowires formed of a uniform composition of a first semiconductor material and configured to emit light of a first wavelength or range of wavelengths;

a third layer; and a second plurality of nanowires established between the second and third layers, the second plurality of nanowires formed of a uniform composition of a second semiconductor material having a bandgap that is different from a bandgap of the first semiconductor material, and the second plurality of nanowires configured to emit light of a second wavelength or range of wavelengths that is different from the first wavelength or range of wavelengths;

the second layer physically separating each of the nanowires in the first plurality from each of the nanowires in the second plurality; and the second layer and at least one of the first layer or the third layer being formed of a semiconductor material or a conducting material.

* * * * *